United States Patent [19]

Shannon et al.

[11] 3,887,936

[45] June 3, 1975

[54] RADIATION SENSITIVE SOLID STATE DEVICES

[75] Inventors: John Martin Shannon; John Ernest Ralph, both of Salfords, near Redhill, England

[73] Assignee: U.S. Philips Corporation, New York, N.Y.

[22] Filed: Sept. 18, 1973

[21] Appl. No.: 398,491

[30] Foreign Application Priority Data

Sept. 22, 1972 United Kingdom .............. 43956/72

[52] U.S. Cl. ................ 357/30; 250/211 J; 307/304; 307/311; 357/15; 357/22; 357/41

[51] Int. Cl. ........................................ H01l 17/00

[58] Field of Search..... 317/235 G, 235 N, 235 UA; 357/24, 15, 30, 41; 307/304, 311; 250/211 J

[56] References Cited

UNITED STATES PATENTS

| | | | |
|---|---|---|---|
| 3,390,295 | 6/1968 | Simmons et al. | 307/311 X |
| 3,539,862 | 11/1970 | Kazan | 307/311 X |
| 3,564,309 | 2/1971 | Hoeberechts et al. | 317/235 UA |
| 3,576,392 | 4/1971 | Hofstein | 317/235 N |
| 3,621,283 | 11/1971 | Teer et al. | 317/235 N |
| 3,624,428 | 11/1971 | Weimer et al. | 317/235 N |
| 3,654,476 | 4/1972 | Hakki | 317/235 N |
| 3,660,697 | 5/1972 | Berglund et al. | 317/235 N |
| 3,683,193 | 8/1972 | Weimer | 317/235 N |
| 3,699,404 | 10/1972 | Simon et al. | 317/235 UA |
| 3,721,839 | 3/1973 | Shannon | 317/235 N |
| 3,786,441 | 1/1974 | Engler et al. | 317/235 N |

OTHER PUBLICATIONS

Weimer et al., "Multi-Element Self-Scanned Mosaic Sensors," IEEE Spectrum, Mar. 1969, pp. 52-65, (TK1. I14).

*Primary Examiner*—William D. Larkins
*Attorney, Agent, or Firm*—Frank R. Trifari; Jack Oisher

[57] ABSTRACT

A solid state radiation sensitive device is described employing JFETs as the sensitive elements. Two terminal construction is achieved by using a common conductor to capacitively couple to the JFET gate and to one of the source and drain connections.

26 Claims, 14 Drawing Figures

RADIATION SENSITIVE SOLID STATE DEVICES

This invention relates to radiation sensitive solid state devices comprising a semiconductor body having a semiconductor layer of one conductivity type, at least one radiation sensitive element being present in the semiconductor layer and comprising a junction field effect transistor structure. Such devices may consist of photo-detectors having gain in the case where the semiconductor layer has a single radiation sensitive element and when the semiconductor layer has a plurality of radiation sensitive elements the devices may be constructed as solid state imaging devices having appreciable gain, for example as imaging devices capable of providing separate electrical output signals indicative of the radiation incident on the individual radiation sensitive elements, as solid state image intensifiers, and as solid state imaging active photocathodes.

The use of an array of junction field effect transistor (JFET) structures in a solid state imaging device is described in U.S. Pat. No. 3,721,839, the JFET's being suitable for operation in the charge storage mode whereby between frame intervals each JFET has its channel blocked by a depletion region formed by pulsing the gate. Under illumination the depletion region withdraws opening up the channel, the extent of the depletion layer withdrawal being determined in accordance with the radiation intensity and the time of illumination. Each imaging JFET can be subjected to non-destructive interrogation one or more times during each frame interval by pulsing its source or drain. At the end of each frame interval the gate is again pulsed to reblock the channel. This charge storage mode of operation permits an output signal to be obtained for each imaging JFET element which represents the total quantity of radiation which is absorbed in the time interval between pulsing the gate at the commencement of the frame period and the application of the interrogation pulse. The amplification provided by the imaging JFET elements may be in the form of voltage gain or charge gain. Using voltage gain, for example, ratios exceeding a thousand in the output voltages with and without radiation incident on the imaging elements can be obtained with a voltage level of the order of volts. In some applications it may be desirable to use the current or charge gain of the transistor without requiring voltage gain. Thus the employment of JFET elements for imaging purposes provides significant advantages many of which arise due to the fact that a JFET element is a device providing gain.

For providing separate output signals indicative of the radiation incident on each imaging JFET element various electrical circuit means may be employed. However for each JFET element three terminal connections are required, namely gate, source and drain. It is possible to construct an array such that either a single source connection or a single drain connection is common to all the JFET sources or JFET drains respectively. This then necessitates two further separate connections for each JFET element, namely connections to gate and source or connections to gate and drain.

This invention is based on the recognition that by the integration of a charge storage capacitor in series with the gate of a JFET in a radiation solid state device comprising at least one JFET structure the terminal connections for the device may be simplified and various advantageous structures obtained by said integration, particularly device structures comprising an array of JFET structures and constructed to operate, for example as solid state image intensifiers and solid state active photocathodes.

According to the invention a radiation sensitive solid state device comprises a semiconductor body having a semiconductor layer of one conductivity type, at least one radiation sensitive element being present in the semiconductor layer and comprising a junction field transistor structure, said junction field effect transistor structure comprising source and drain connections at positions spaced apart laterally of the semiconductor layer whereby in the layer portion situated intermediate said connections a substantially lateral flow of charge carriers characteristic of said one conductivity type can occur in a channel region. At least one of said source and drain connections is present at or adjacent a first surface of the semiconductor layer. A gate electrode is situated at or adjacent said first surface in the proximity of the channel region and forms a rectifying junction with the semiconductor layer material of the one conductivity type whereby said lateral current flow in the channel region is determined in accordance with the extent of a depletion region associated with and extending into the layer from said rectifying junction, said gate electrode being connected via a storage capacitor present at or adjacent to said first surface to the said one of the source and drain connections. A first terminal connection forms a common connection to said one of the source and drain connections and to the side of the capacitor remote from the gate electrode, and a second terminal forms a connection to the other of said source and drain connections. Means are being present to permit incident radiation to be absorbed in the semiconductor layer in the vicinity of the channel region for generation of free charge carriers in order to influence the extent of the depletion region associated with the gate electrode rectifying junction.

In this device due to the provision of the storage capacitor and its connection to the said one of the source and drain connections and the said provision of the first terminal connection which forms the said common connection, the number of main terminal connections associated with the or each JFET structure is only two, namely the first and second terminal connections. This permits relatively simple structures to be formed and in some instances as will be described hereinafter the device may only have one terminal connection adjacent the first surface, these features being of significant advantage when it is desired to construct an imaging device as a solid state image intensifier or as a solid state imaging active photocathode in which the electroluminescent emission or electron emission occurs adjacent the first surface of the semiconductor layer.

The charge storage mode of operation of a device in accordance with the invention will now be considered in terms of a single JFET structure present in the semiconductor layer of the one conductivity type. At the commencement of the frame period a relatively large pulse is applied to the first terminal connection, this pulse being of appropriate polarity to bring the rectifying junction associated with the gate electrode into the forward direction and thus charge the series connected storage capacitor. After application of this pulse the discharge path of the storage capacitor forces the rectifying junction into a reverse biased condition and produces a depletion layer which extends into the channel region of the JFET structure. With no radiation incident this depletion layer will remain in existence during a frame interval except for a slow discharge due to dark current leakage. With radiation incident, any radiation that is absorbed in the semiconductor layer and yields electron hole pairs in the depletion region or within a diffusion length of the depletion region will have the effect of causing the gate electrode rectifying junction to be discharged and the depletion region retracts. The extent of the reaction of the depletion region and thus the size of the channel region for current conduction between the source and drain connections will depend upon the intensity of the radiation and the period of incidence of the radiation following the charging of the gate rectifying junction. Thus in each frame interval the JFET structure will integrate the free charge carriers generated by the incident radiation for the entire period. Non-destructive interrogation may be carried out at any time during the frame interval by applying a relatively smaller pulse of appropriate polarity to one of the first and second terminal connections to initiate a current flow in the channel region, the amount of such current flow and hence the signal in an output circuit depending upon the size of the channel region. Alternatively continuous interrogation may be achieved by applying a constant D.C. bias between the first and second terminal connections, the charging pulses between frame intervals being superimposed on the constant D.C. bias. This charge storage mode of operation is similar to that described in Pat. No. 3,721,829.

The magnitude of the interrogation pulse or constant D.C. bias and the situation of the first terminal connection with respect to the capacitor and the said one of the source and drain connections must be chosen such that the capacitor is not charged during the interrogation. Various configurations may be employed for the storage capacitor with this in view. In one preferred form an insulating layer is present at said first surface of the semiconductor layer and extends on the gate electrode, the storage capacitor being formed by the capacitive connection of the gate electrode via the insulating layer to the said one of the source and drain connections by a conductive layer which overlies at least a part of the insulating layer present on the gate electrode, the first terminal connection being applied to said conductive layer. In some forms of the device in accordance with the invention to be described hereinafter the conductive layer may be a metal layer and in other forms the conductive layer may be of semiconductor material.

Other possibilities exist for the provision of the storage capacitor, for example it may be formed by a p-n junction formed between regions of different conductivity type in the same semiconductor material, a Schottky junction formed between a metal layer and a semiconductor layer, or by a heterojunction between different semiconductor materials.

In preferred forms of the device in accordance with the invention the or each JFET structure is such that the channel region can be blocked on application of the resetting pulse at the commencement of each frame interval. In order to achieve this various structural means may be employed whereby at the surface of the semiconductor layer opposite the said first surface a rectifying junction is present. Thus in one preferred group of devices in accordance with the invention the semiconductor layer of the one conductivity type is present on a semiconductor substrate of the opposite conductivity type, said first surface of the semiconductor layer being the surface remote from the substrate. The channel of the or each JFET structure can be blocked on application of the resetting pulse by choosing the magnitude of the resetting pulse such that for the or each JFET structure the depletion region extends into the layer of the one conductivity type to meet a second depletion region which is associated with the p-n junction between the substrate and the layer, said second depletion region being formed by applying a reverse bias across the p-n junction. However in a preferred form of operation the substrate/layer p-n junction is not separately biased and operation is effected in a so-called punch-through mode whereby the resetting pulse causes the depletion region associated with the gate electrode junction to punch through to the substrate. When this occurs injection of minority charge carriers occurs into the layer from the substrate and the depletion region just extends to the substrate/layer p-n junction and no further but blocks the channel of the JFET structure. This punch-through mode of operation is extremely advantageous when the device comprises a plurality of JFET structures because all the radiation sensitive elements formed by the JFET structures irrespective of differences in the voltages required to achieve the punch-through condition in the individual structures can be completely blocked with all the depletion regions extending at the interface by applying a resetting pulse large enough to block the channel of the JFET element having the highest punch-through voltage. Under these conditions an output signal voltage, below saturation, is independent of both the magnitude of the resetting pulse and the punch-through voltages of the JFET structures. Thus for use in said preferred form of operation where the substrate/layer p-n junction is unbiased, said first group of devices may comprise means connecting the other of said source and drain connections to the substrate.

In a second preferred group of devices in accordance with the invention at a second surface of the semiconductor layer situated opposite the first surface a conductive layer is present which forms a Schottky junction with the semiconductor layer material of the one conductivity type. The conductive layer forming the Schottky junction may be considered as an equivalent of the substrate of the opposite conductivity type in the previously described first preferred group of devices. However the use of a conductive layer forming a Schottky junction with the semiconductor layer of the one conductivity type has various advantages in certain configurations of the device in accordance with the invention. In particular when it is desired to construct a device in which the incident radiation is directed onto the JFET sensing element or elements from the second side of the layer of the one conductivity type the use of a Schottky Junction forming conductive layer is advantageous because such a conductive layer, which may be of a relatively small thickness, can be provided so as to allow passage of the incident radiation. This may be significantly better than the use of a semiconductor substrate of the opposite conductivity type because undesired absorption of incident radiation may occur in the substrate and thus severe restrictions placed upon its thickness. For possible operation in a punch-through mode means may be present connecting the said other of the source and drain connections to the conductive layer at the second side of the semiconductor layer of the one conductivity type. In a particularly simple form the said other connection may be formed by a highly doped surface region of the one conductivity type at the second side of the semiconductor layer, the doping of such a surface region being such that the Schottky junction forming conductive layer makes an ohmic connection to said surface region. For operation in a punch-through mode it must be ensured that the barrier height for minority carrier injection is small.

The gate electrode situated at or adjacent the first surface of the semiconductor layer of the one conductivity type may be formed in various ways. For example the gate electrode may consist of a surface region of the opposite conductivity type in the semiconductor layer of the one conductivity type. In another form the gate electrode may consist of a metal layer applied on the first surface of the semiconductor layer of the one conductivity type and forming a Schottky junction with the layer material of the one conductivity type. In a further form the gate electrode may consist of a layer of a different semiconductor material applied on the surface of the semiconductor layer of the one conductivity type and forming a rectifying heterojunction.

In a device in accordance with the invention wherein a plurality of radiation sensitive elements are present in the semiconductor layer of the one conductivity type, each element may comprise a JFET structure having a gate electrode which surrounds the said one of the source and drain connections. In this manner, when operating the device in a punch-through mode or when operating the device such that the resetting pulse blocks each JFET channel by producing gate junction depletion layers which meet an oppositely located depletion region formed by reverse biasing a junction, such as a substrate/layer p-n junction or a Schottky junction, isolation between the individual JFET structures is achieved.

Such a device comprising a plurality of radiation sensitive elements may consist of a solid state imaging device capable of yielding separate electrical output signals indicative of the radiation absorbed in the channel region of each JFET structure. For the possible means of deriving said separate electrical output signals reference is invited to said Pat. No. 3,721,839. In one preferred form the first terminal connections associated with the plurality of JFET structures are individually provided and the second terminal connections associated with said plurality of JFET structures are provided as a common terminal.

Another device in accordance with the invention and comprising a plurality of radiation sensitive elements consists of a solid state image conversion and/or display device wherein the first terminal connections associated with the plurality of JFET structures are provided as a first common terminal connection and the second terminal connections associated with said plurality of JFET structures are provided as a second common terminal connection. Such a device may consist of a solid state image intensifier, wherein for each radiation sensitive element formed by a JFET structure electroluminescent means are situated in the series connection between the said one of the source and the drain connections and the first common terminal connection and/or in the series connection between the other of said source and drain connections and the second terminal connection, the output of each electroluminescent means being determined in accordance with the current flow in the channel region of the associated JFET structure when applyng a potential difference between the first and second common terminal connections.

The electroluminescent means may each comprise a portion of a semiconductor layer of the opposite conductivity type, the drain connections of the plurality of JFET structures being present at the first surface of the semiconductor layer of the one conductivity type and formed by said semiconductor layer of the opposite conductivity type. In one such configuration an insulating layer is present on the first surface and overlies the gate electrodes of the JFET structures, the semiconductor layer of the opposite conductivity type forming the drain connections at openings in the insulating layer and further extending on the insulating layer above the gate electrodes to form the capacitive connections between the gate electrodes and the drain connections. The first terminal connections associated with each JFET structure may consist of metal layer portions on the surface of the semiconductor layer of the opposite conductivity type, said metal layer portions being situated above the drain connections and being interconnected to form a first common terminal connection by further metal layer portions present on the surface of the semiconductor layer of the opposite conductivity type. In one specific form of this configuration of an image intensifier device said metal layer portions situated on the semiconductor layer of the opposite conductivity type above the drain connections form radiation emissive Schottky junctions with the semiconductor layer of the opposite conductivity type. In another specific form the drain connections formed by the semiconductor layer of the opposite conductivity type may themselves constitute radiation emissive p-n junctions, in which case the metal layer on the surface of the semiconductor layer of the opposite conductivity type is chosen such that it forms an ohmic connection to said layer.

In other forms of the image intensifier device the electroluminescent means each comprise a surface region of the opposite conductivity type extending in the semiconductor layer, the drain connections of the plurality of JFET structures being present adjacent the first surface and formed by the surface regions of the opposite conductivity type, each drain connection also constituting a radiation emission p-n junction. In one form of such an image intensifier device an insulating layer is present on the first surface and overlies the gate electrodes of the JFET structures, a plurality of openings being present in the insulating layer where said regions of the opposite conductivity type extend at the first surface, a metal layer forming contact to said regions of the opposite conductivity type in said openings and further extending on the insulating layer above the gate electrodes to form the capacitive connections between the gate electrodes and the drain connections, the metal layer constituting the first terminal connections of the junction field effect transistor structures which connections are interconnected by the metal layer as a first common terminal, the metal layer being of such a material and thickness as to permit transmission of the radiation emitted by the p-n junctions.

A device in accordance with the invention comprising a plurality of radiation sensitive JFET elements may consist of an imaging active photocathode, that is an imaging photocathode having gain, wherein the semiconductor material of the layer of the one conductivity type is of n-type conductivity and for each radiation sensitive element the said one connection at the first surface is the drain connection of the junction field effect transistor structure, said drain connections each being formed by p-type semiconductor material and constituting injecting connections for injection of electrons into the p-type semiconductor material, means being present for permitting injected electrons to emerge from the p-type semiconductor material.

In one preferred form of such an imaging active photocathode an insulating layer is present on the one surface and overlies the gate electrodes of the junction field effect transistor structures, a plurality of openings being present in the insulating layer, a layer of p-type semiconductor material extending in said openings and forming the electron injecting drain connections, said p-type layer further extending on the insulating layer above the gate electrodes to form the capacitive connections between the gate electrodes and the drain connections. In such an imaging active photocathode the first terminal connections of the junction field effect transistor structures may consist of metal layer portions situated on the surface of the p-type semiconductor layer in the proximity of the electron injecting drain connections, said metal layer portions being interconnected to form a first common terminal connection by further metal layer portions present on the surface of the p-type semiconductor layer. Various materials may be used for the p-type semiconductor layer either with or without surface treatments for lowering the work function of electrons. In a preferred form surface portions of the p-type semiconductor layer situated opposite the electron injecting connections are coated with a material reducing the work function of electrons, the coating and the p-type semiconductor material being such that the work function of the coating applied is substantially equal to a less than the distance between the Fermi level and the bottom of the conduction band in the p-type semiconductor material.

Embodiments of the invention will now be described, by way of example, with reference to the accompanying diagrammatic drawings in which.

Figure 1:
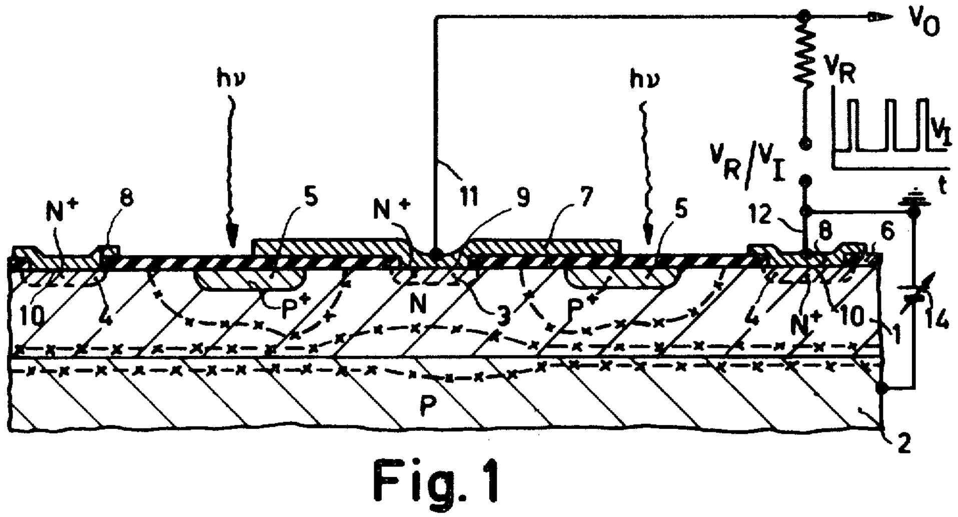
FIG. 1 shows in cross-section part of a device in accordance with the invention in the form of a simple optical detector comprising a single radiation sensitive element having a JFET structure, the Figure also showing the circuit connections for operation of the device.
Figure 2:
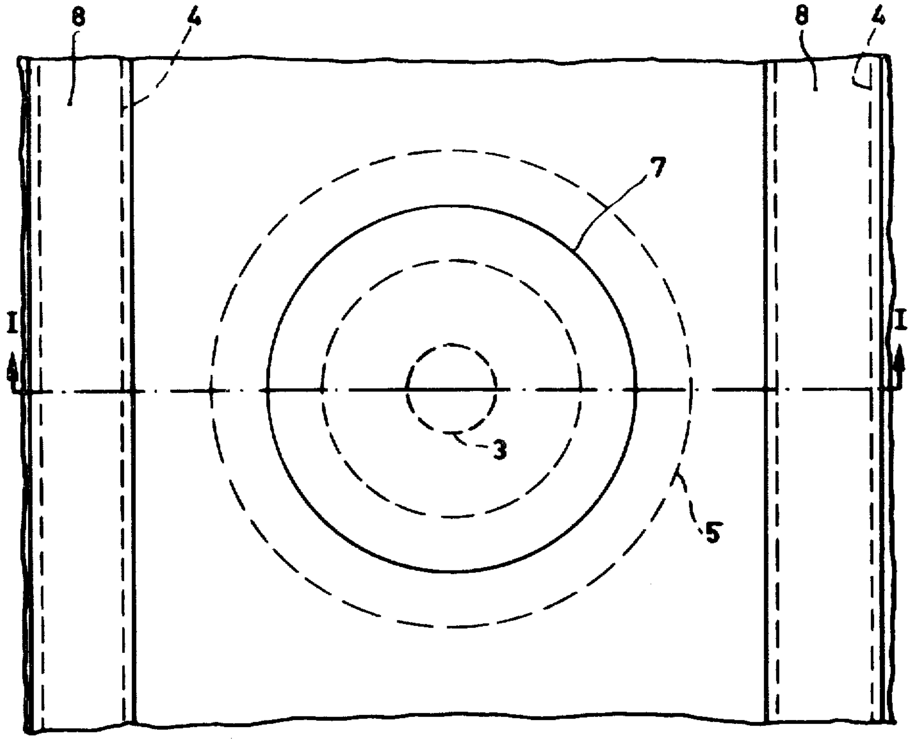
FIG. 2 is a plan view of part of the device shown in FIG. 1, the section of FIG. 1 being taken along the line I—I of FIG. 2.

Referring now to FIGS. 1 and 2, the optical detector device comprises a semiconductor body having an n-type semiconductor layer 1 of silicon, for example of 10 ohm.cm. resistivity and 5 microns thickness. The n-type layer 1 is an epitaxial layer situated on a p-type silicon substrate 2, for example of 1 ohm.cm. resistivity. A radiation sensitive element is present in the n-type layer 1 and comprises a JFET structure. This JFET structure comprises an $n^+$-surface region 3 of circular outline lying within and surrounded by a further $n^+$-surface region 4, the region 4 having a strip form of square outline but only shown in part in FIG. 2. The regions 3 and 4 constitute drain and source electrode regions of the JFET structure. An annular $p^+$ surface region 5 surrounds the $n^+$ region 3 and lies surrounded by the $n^+$ region 4. The $p^+$ region 5 constitutes the gate electrode of the JFET structure and forms a p-n junction with the n-type layer 1 whereby a depletion region can be formed extending into the layer 1. An insulating layer 6 is present on the upper surface of the layer 1. A metal layer 7 of circular outline extends in an opening in the insulating layer 6 in contact with the $n^+$ region 3 and further extends on the insulating layer above part of the gate electrode 5. A further metal layer 8 in the form of a strip of square outline, only two of the sides thereof being shown in FIG. 2, extends in an opening in contact with the $n^+$ region 4. The metal layers 7 and 8 at their contacts with the $n^+$ regions 3 and 4 constitute drain and source connections 9 and 10 respectively which are spaced apart laterally of the layer 1, an n-type channel region of the JFET structure being situated in the portion of the layer intermediate said connections in which a substantially lateral flow of electrons can occur between said connections. This substantially lateral flow of electrons is determined in accordance with the extent of a depletion region extending into the layer 1 from the p-n junction between the annular $p^+$ gate electrode 5 and the n-type layer 1.

The metal layer 7 on the insulating layer 6 where it overlies the gate electrode 5 forms together with said insulating layer and gate electrode a Metal-Oxide-Semiconductor (MOS) storage capacitor. Thus the gate electrode 5 is connected via said storage capacitor to the drain electrode connection 9. The metal layer 7 which has a lead 11 connection thereto constitutes a first terminal connection which thus forms a common connection to the drain connection 9 and to the side of the storage capacitor remote from the gate electrode 5. The metal layer 8 which has a lead 12 connected thereto constitutes a second terminal connection which forms a connection to the source connection 10. As the metal layer 7 only lies above part of the gate electrode 5 radiation to be detected and of appropriate wavelength which is incident at the upper side of the semiconductor body can penetrate to the semiconductor layer and be absorbed in the vicinity of the channel region for the generation of free charge carriers. Any free charge carriers which are generated in the depletion region associated with the gate p-n junction between the $p^+$ gate electrode 5 and the n-type layer 1 or within a diffusion length of said depletion region will cause the depletion region to contract and thus open up the channel region.

The charge storage mode of operation of the device will now be described with reference to FIGS. 1, 3 and 4. The metal layer 8 forming a second terminal connection is connected via the lead 12 and variable D.C. bias source 14 to the substrate 2. In this manner the p-n junction between the substrate 2 and the layer 1 can be reverse biased if desired. A resistor R is connected in series with the lead 11 to the first connection formed by the metal layer 7. Between the resistor R and the lead 12 an input pulse source $V_R/V_I$ is present. An output voltage $V_o$ may be derived as shown. The input pulse source provides a series of voltage pulses with frame periods $t_F$, for example of 5 milliseconds, between application of successive pulses. The pulses have a maximum value $V_R$, for example of 15 volts and a duration of 1 microsecond. The effect of the application of each voltage pulse $V_R$ is to block the channel of the JFET structure. This is achieved because the pulse $V_R$, hereinafter referred to as the resetting pulse, is applied in such a sense that metal layer 7 is positive with respect to the metal layer 8 and the gate p-n junction comes in the forward direction and the MOS storage capacitor becomes charged, whereupon on collapse of the pulse the discharge path of the MOS storage capacitor forces the gate p-n junction into reverse bias and a depletion region is formed extending from said junction into the layer 1. The magnitude and duration of $V_R$ is chosen such that the depletion region extends sufficiently far into the n-type layer 1 to block the JFET channel. In the case of an applied reverse bias on the substrate/layer p-n junction provided by D.C. bias source 14 it is sufficient that the gate p-n junction depletion layer meets the depletion layer associated with the substrate/layer p-n junction. However in the preferred mode of operation referred to hereinafter as the punch-through mode there is no D.C. bias source 14 present, the metal layer 8 being connected directly to the substrate 2. When the gate p-n junction depletion region reaches the substrate/layer p-n junction, the p-type substrate injects holes into the layer 1 and the gate p-n junction depletion region is thereby limited and extends up to but not beyond the substrate/layer p-n junction.

Following application of the resetting pulse incident radiation absorbed which generates free charge carriers in the gate p-n junction depletion region or within a diffusion length thereof causes the depletion region to withdraw thus opening up the channel. In each frame interval the JFET structure will integrate the free charge carriers generated by the incident radiation. Non-destructive interrogation may be carried out during frame intervals in various ways. In one form it is achieved by applying a pulse $V_I$ of the same polarity as $V_R$, but of smaller magnitude and of longer duration, between the metal layers 7 and 8 to cause current flow through the channel. The output voltage $V_o$ is a measure of the free charge carriers generated by absorption of radiation in the depletion region or within a diffusion length thereof in the period between application of the resetting pulse and the interrogation pulse. The interrogation pulse may be applied at any time during the frame interval and a plurality of interrogation pulses may be applied during each frame interval. In another form interrogation is carried out by superimposing the resetting pulse $V_R$ on a constant D.C. bias $V_I$. If the pulses $V_R$ have a maximum of, for example 15 volts, then $V_I$ may be, for example 2 volts. The effect of the constant D.C. bias $V_I$ is such that continuous interrogation is achieved and the output signal $V_o$ will increase during each frame interval as long as radiation is incident on the JFET structure. If at any time during a frame period the incident radiation falls to zero then the output signal will thereafter remain constant until the application of the resetting pulse at the commencement of the next frame period. FIG. 1 shows in broken outline the boundaries of the depletion regions associated with the gate p-n junction and the substrate/layer p-n junction at a certain time during a frame interval when radiation is incident and has caused the gate depletion region to retract thus opening up the channel. The depletion region associated with the substrate/-layer p-n junction has a greater thickness below the $n^+$-region 3 than below the $n^+$-region 4 due to the lateral voltage drop in the layer between the regions 3 and 4.

Figure 3:
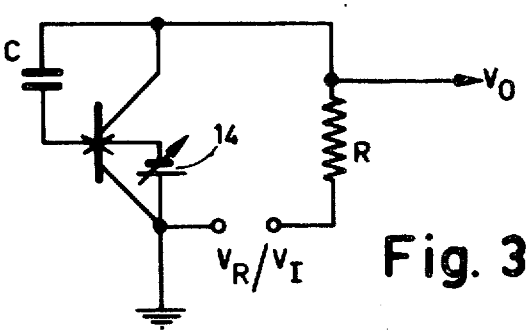
FIG. 3 is a circuit diagram of the device shown in FIG. 1 and its electrical circuit connection when in operation.

FIG. 3 shows a circuit diagram of the device shown in FIGS. 1 and 2 and its circuit connection. The JFET structure may be considered as one in which there is no direct external connection to the gate, the gate being connected to the drain via the storage capacitor C and a single terminal connection made to the drain and the side of the capacitor remote from the gate. The source is shown connected to the substrate via the D.C. bias 14 but may be directly connected as already mentioned.

Figure 4:
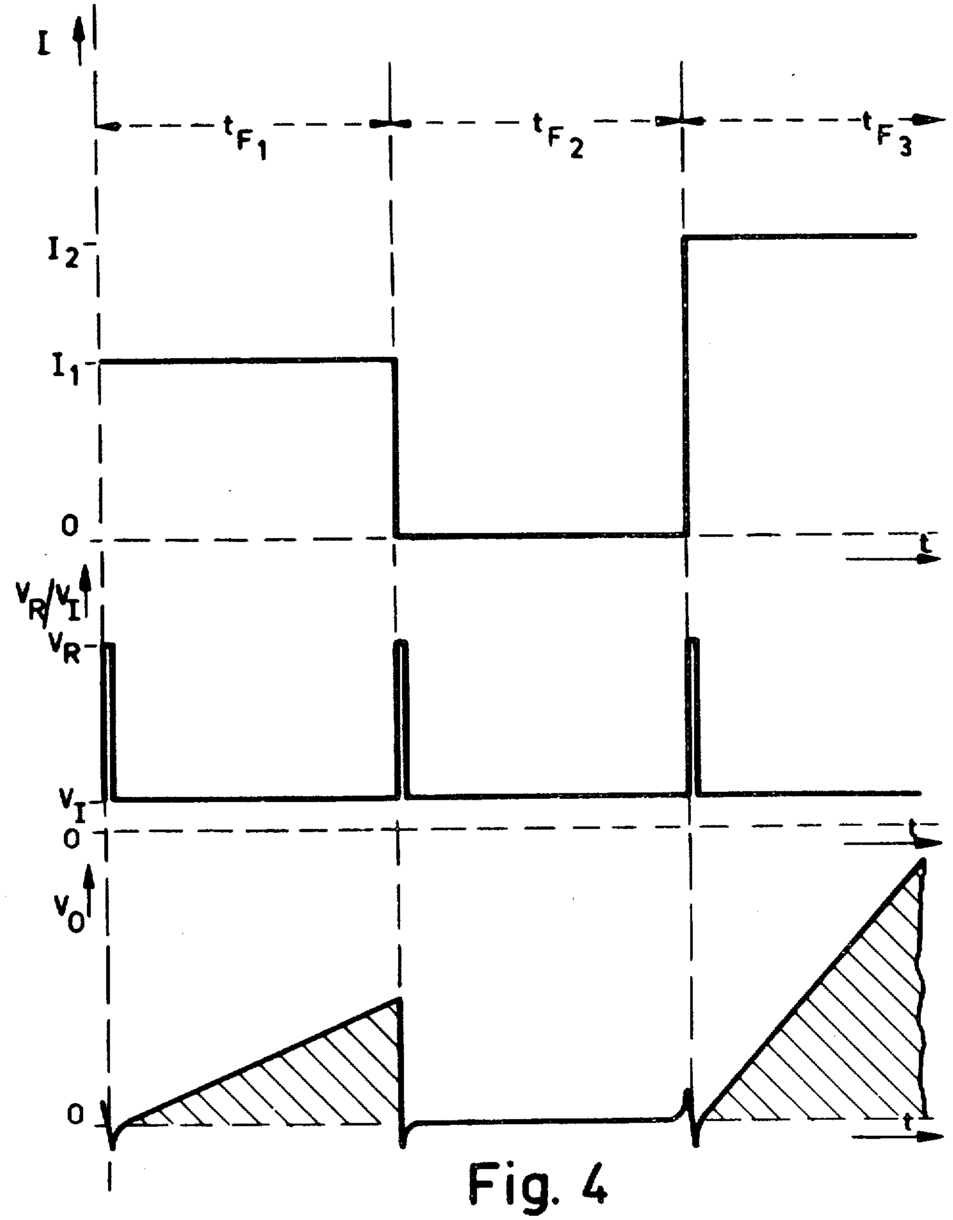
FIG. 4 shows various voltage waveforms associated with the circuit of FIG. 3 during operation of the device under various conditions of incident radiation.

FIG. 4 shows the punch-through mode of operation with a resetting pulse $V_R$ superimposed on a constant D.C. bias interrogation voltage $V_I$. During frame interval $t_{F_1}$ radiation of intensity $I_1$ is incident at the upper surface, during the succeeding frame interval $t_{F_2}$ no radiation is incident and during the next succeeding frame interval $t_{F_3}$ radiation of intensity $I_2$ is incident where $I_2 > I_1$. The output voltage $V_o$ waveform is also shown in FIG. 4, $V_o$ rising during $t_{F_1}$ due to the integrating effect of the JFET structure and falling to zero at the end of $t_{F_1}$ on application of the resetting pulse $V_R$ to block the channel. As the incident radiation is absent during $t_{F_2}$ the output voltage remains at zero and rises again during $t_{F_3}$ when radiation of intensity $I_2$ is present, the JFET structure again integrating the free charge carriers generated during $t_{F_3}$. The value of the output voltage will depend upon the value of the load resistor R and the total charge passing through the load resistor R during a frame interval will be much greater than the charge generated by the incident radiation during that interval. When R is small the charge gain may exceed $10^5$.

Figure 5:
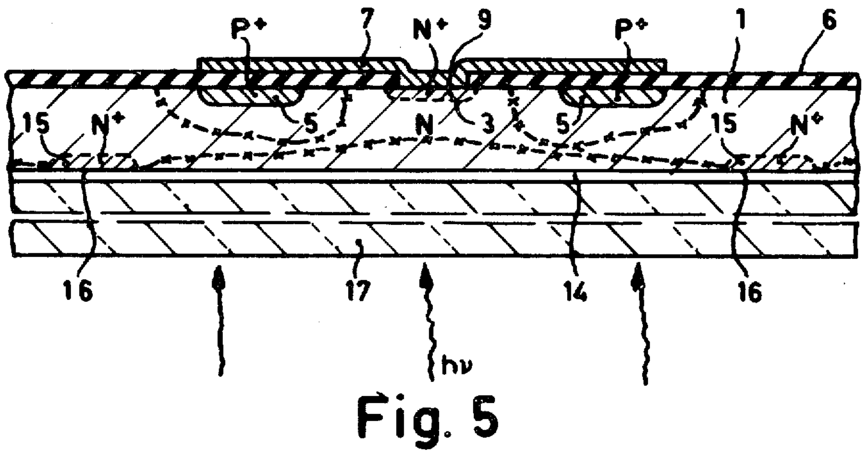
FIG. 5 shows in cross-section part of a modification of the embodiment shown in FIGS. 1 and 2.

FIG. 5 shows in cross section part of a modification of the optical detector device shown in FIGS. 1 and 2 corresponding parts being indicated with the same reference numerals. This device is constructed to be suitable for operation with radiation incident at the lower side of the semiconductor layer. At the lower side of the n-type silicon layer 1 there is a continuous metal layer 14, for example of platinum, this layer being of relatively small thickness and allowing passage of incident radiation to be detected. The metal layer 14 forms a Schottky junction with the high resistivity n-type silicon layer 1. A surface $n^+$ region 15 of dimensions and doping corresponding to the $n^+$ region 4 in FIG. 1 is present at the lower side of the n-type semiconductor layer 1, the layer 15 forming a source electrode region. The source connection is formed by the connection 16 of the metal layer 14 to the $n^+$ region 15, the doping of the $n^+$ region 15 being sufficiently high to produce an ohmic connection 16. The semiconductor layer 1 having the applied metal layer 14 is mounted on a glass support member 16 which allows passage of incident radiation to be detected. As the radiation is incident from the lower surface of the body the requirement of transmission of incident radiation by layers at the upper surface of the body does not arise and therefore in the device shown in FIG. 5 the metal layer 7 completely overlaps the gate electrode 5 thus increasing the capacitive coupling of the gate electrode 5 to the drain connection 9. This device has only two terminal connections, the first of these being formed by the metal layer 7 and the second being formed by the metal layer 14. Operation of the device in the charge storage mode may be effected similar to that described with reference to FIG. 1 when the source is directly connected to the substrate. In this device when punch-through of the gate depletion region occurs the Schottky junction between the metal layer 14 and the n-type layer 1 is capable of injecting minority carriers into the n-type layer 1 to limit the depletion region at the metal/layer interface providing the barrier for minority carrier injection is small.

Devices in accordance with the invention may be formed having a plurality of radiation sensitive elements in which each element comprises a JFET structure as shown in FIGS. 1 and 2 or FIG. 5. It will be appreciated that such devices may be constructed for operation as imaging devices capable of yielding separate electrical output signals indicative of the radiation incident upon each JFET sensing element, said type of operation being fully described in U.S. Pat. No. 3,721,839. However when using the structures of FIGS. 1 and 2 and FIG. 5, the terminal connections of the individual JFET elements are considerably simplified in comparison to the structures described in said patent, in effect being reduced in number from three to two. Furthermore in the structure of FIG. 5 at the upper surface of the semiconductor layer only one terminal connection is present for each JFET element.

Further embodiments of imaging devices in accordance with the invention in which a plurality of JFET structures are present in a common semiconductor layer will now be described, the structure of such imaging devices being such that only two common terminal connections are present for the complete array of imaging elements.

Figure 6:
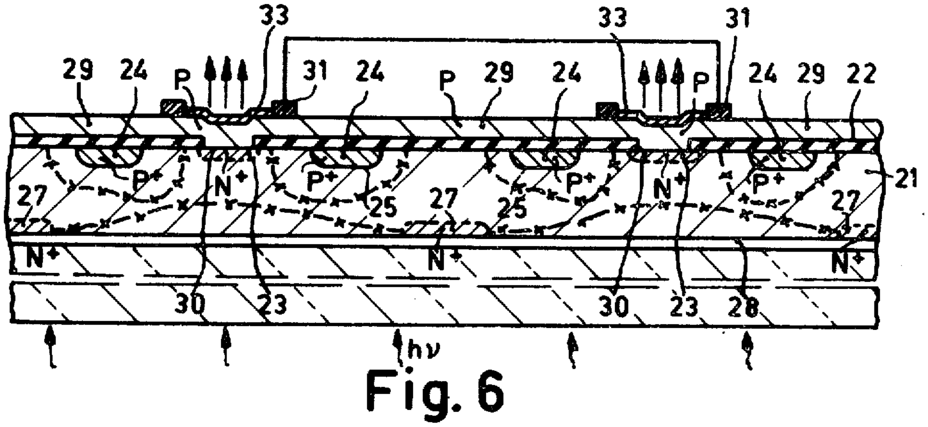
FIG. 6 shows in cross-section part of a solid state imaging active photocathode device in accordance with the invention.
Figure 7:
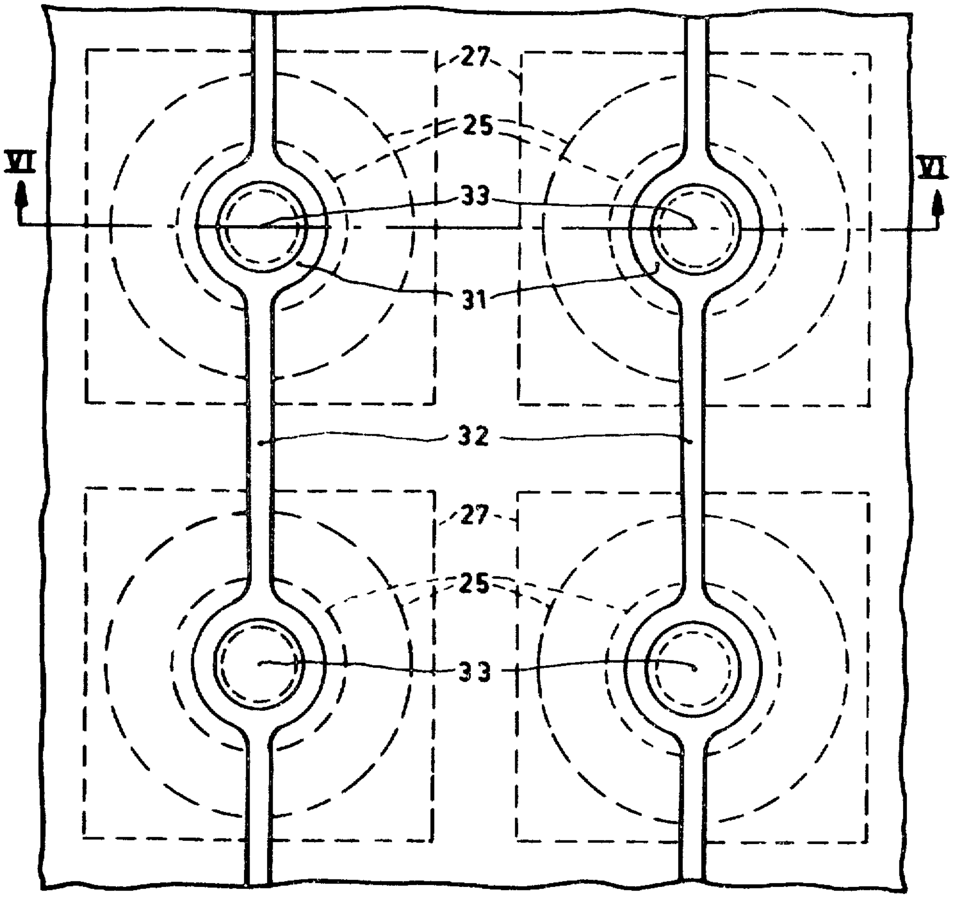
FIG. 7 shows a plan view of part of the device shown in FIG. 6, the section of FIG. 6 being taken along the line VI—VI of FIG. 7.

FIGS. 6 and 7 show part of a two terminal imaging active photocathode. A semiconductor layer 21 of n-type conductivity, for example of silicon is present and comprises an array of JFET structures, two of which are shown in the cross-section of FIG. 6 and four of which are shown in the plan view of FIG. 7. On the surface of the n-type layer 21 there is an insulating layer 22 of silicon oxide. Each JFET structure comprises a central $n^+$ drain electrode region 23 of circular outline which is surrounded by an annular $p^+$ gate electrode region 24, the gate electrode regions forming p-n jnctions 25 with the n-type layer 21. The source electrode regions of all the JFET structures are formed by a single $n^+$ region 27 in the form of an $n^+$ grid region at the lower surface of the n-type layer 21, the apertures in the grid being symmetrically disposed with respect to the overlying circular drain electrode regions 23. On the lower surface of the n-type layer 21 there is a thin metal layer 28 for example of platinum, which forms an ohmic connection to the $n^+$ source electrode region 27 and a Schottky junction with the other portions of the n-type surface layer 21. The layer 21 with applied metal layer 28 which allows passage of radiation incident as shown, is supported by a glass plate also permitting passage of the incident radiation.

On the surface of the insulating layer 22 there is a deposited layer of high resistivity p-type polycrystalline silicon. The layer 29 extends in openings in the insulating layer 22 and forms drain connections 30 with the $n^+$ drain electrode regions 23. The drain connections 30 also constitute injecting connections for injection of electrons from the $n^+$ regions 23 into the overlying portions of the p-type layer 29. Situated on the surface of the p-type layer 29 there are a plurality of annular metal layer portions 31 which form ohmic connections to the layer 29. The metal layer portions 31 each surround the drain connection 30 of an imaging JFET structure and constitute first terminal connections of the JFET structures. Further metal layer portions 32 in the form of strips extend on the surface of the p-type layer 29 and interconnect the annular metal layer portions 31. Thus the first terminal connections form part of a first common terminal. The second terminal connections of the JFET structures are formed by the metal layer 28 which forms ohmic connections to the $n^+$ source grid region 27. Thus the second terminal connections form a second common terminal.

In each JFET structure the $p^+$ gate electrode region 24 is capacitively connected to the drain connection 30. This is achieved due to the p-type layer 29 overlying the insulating layer 22 above the annular gate electrode region 24. The p-type layer 29, insulating layer 22 and gate electrode region 24 thus constitutes a storage capacitor and the first terminal connection formed by the metal layer portion 31 thus forms a common connection to the drain connection 30 and the side of the storage capacitor remote from the gate electrode.

On the surface portions of the p-type layer 29 within the annular metal layer portions 31 there is a coating 33 of a material for reducing the electron work function, for example of cesium or caesium oxide. Electrons injected into the p-type layer 29 by the injecting drain connection 30 can emerge from the surface of the coatings when the device is placed in an evacuated enclosure under a suitable external electric field. As in known semiconductor cold cathodes the distance between the injecting connection and the emissive surface must be chosen to be not substantially greater than a diffusion length and with this in view the thickness of the p-type layer is chosen accordingly. Electron emission may be obtained when the conduction occurs in the respective JFET structure between source and drain connections. By simultaneous operation of all the JFET structures in the charge storage mode of operation as described with reference to FIGS. 1 and 2 and FIG. 4 for a single JFET element an imaging photocathode is obtained having appreciable gain due to the amplification provided by each JFET structure. Thus a radiation pattern incident as shown at the lower side of the device may be converted into an electron emission pattern as shown at the upper side of the device, the conversion being obtained with gain. Isolation between individual emissive surface parts of the p-type layer 29 is achieved due to the p-type layer 29 having a high resistivity.

In a modification of the embodiment shown in FIGS. 6 and 7, the n-type layer 21 is present on a p-type substrate, the source electrode region being present at the upper surface of the layer 21. The incident radiation pattern is directed at the upper side of the device and for this purpose the p-type semiconductor layer 29 is made sufficiently thin to be radiation transmitting.

Figure 8:
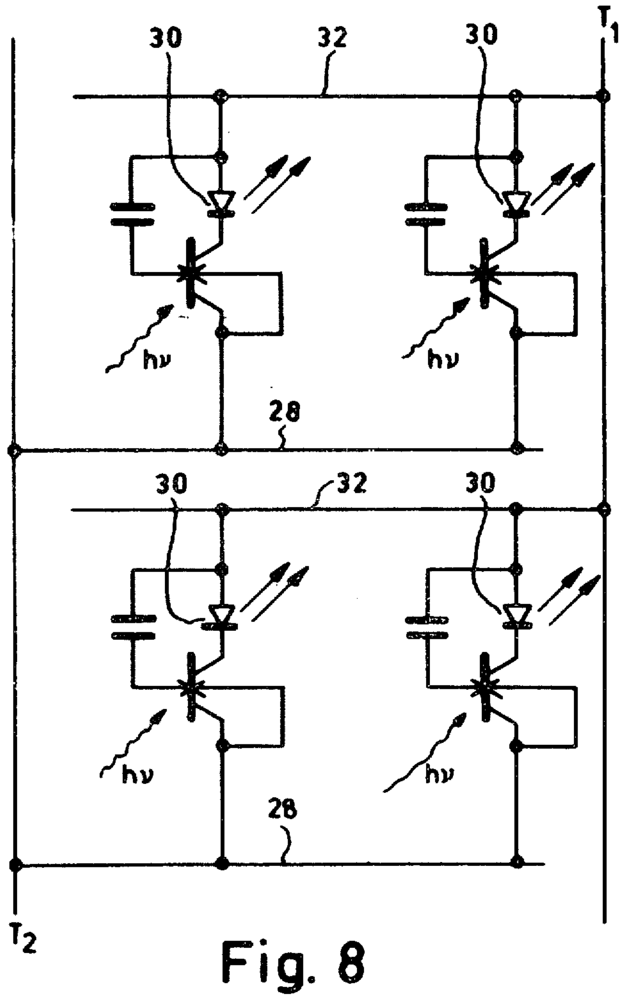
FIG. 8 shows a circuit diagram of the part of the device shown in FIG. 7.

FIG. 8 shows a circuit diagram of the part of the device shown in FIG. 7. The first common terminal connection $T_1$ is formed by the metal layer portions 31, 32 at the upper surface and the second common terminal connection $T_2$ is formed by the metal layer 28 at the lower surface. The p-n junction electron injecting drain connections 30 are shown and electron emission is shown emanating from the p-type regions. FIG. 6 shows the condition during a frame interval between resetting pulses with radiation incident, the channels of the two JFET elements being unblocked and conduction occurring between source and drain connections due to application of an interrogation voltage between $T_1$ and $T_2$.

Figure 9:
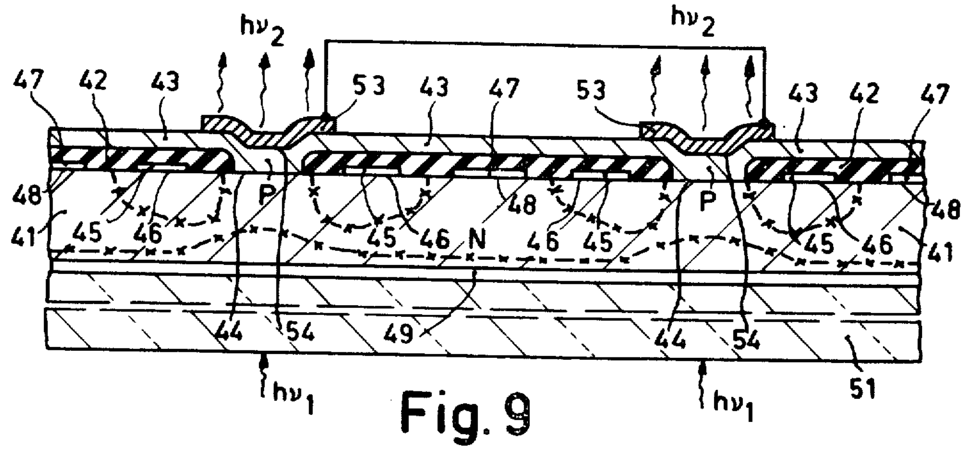
FIG. 9 shows in cross-section of part of a solid state image intensifier device in accordance with the invention.
Figure 10:
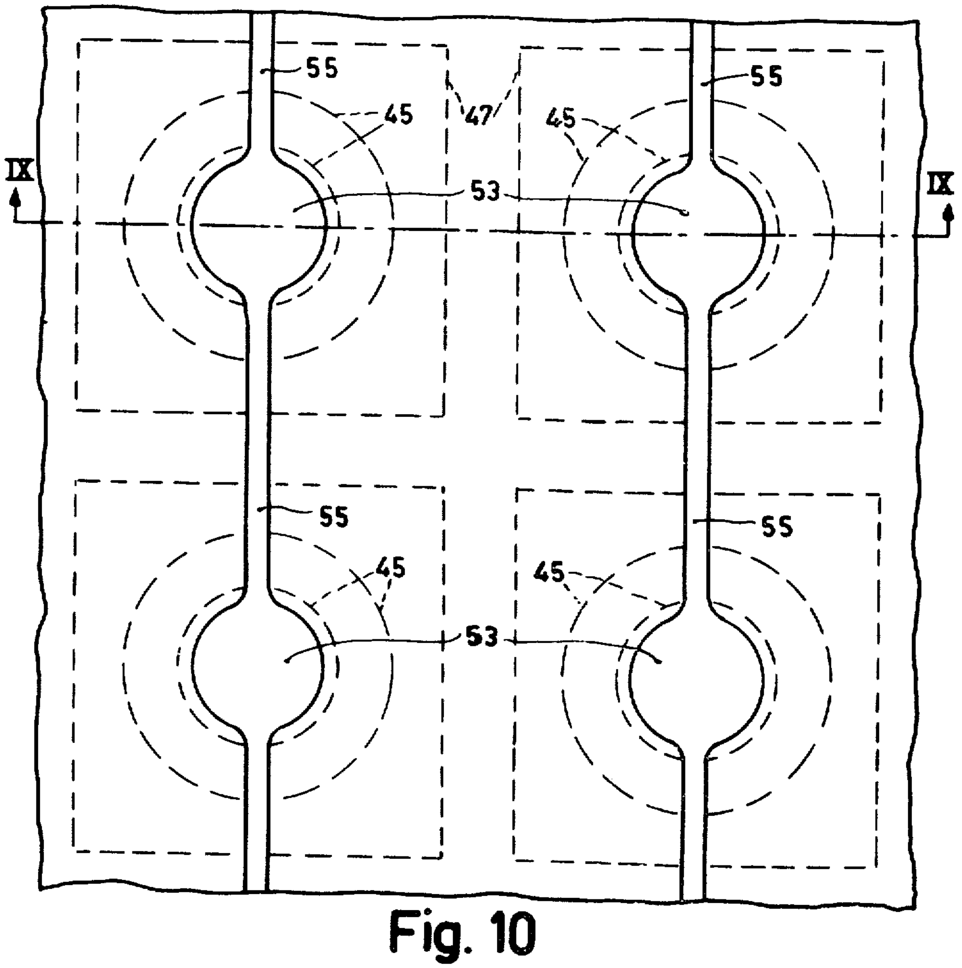
FIG. 10 shows a plan view of part of the device shown in FIG. 9, the section of FIG. 9 being taken along the line IX—IX of FIG. 10.

FIGS. 9 and 10 show part of a two terminal solid state image intensifier. A semiconductor layer 41 of n-type conductivity, for example of zinc oxide powder in a suitable binder is present and comprises an array of JFET structures, two of which are shown in the cross-section of FIG. 9 and four of which are shown in the plan view of FIG. 10. On the surface of the n-type layer 41 there is an insulating layer 42 of silicon oxide. Each JFET structure comprises a central opening of circular outline in the insulating layer 42 in which a p-type semiconductor layer 43, for example of zinc telluride, extends and forms drain connections 44. Each of said circular openings and drain connections 44 is surrounded at the surface of the layer 41 by an annular gate electrode 45 consisting of a metal layer, for example of platinum, which forms a Schottky junction 46 with the n-type semiconductor layer 41. The gate electrodes 45 are entirely covered by the insulating layer 42. The source electrodes of all the JFET structures are formed by a metal layer gride 47, for example of aluminum, which forms ohmic source connections 48 to the upper surface of the layer 41. The grid 47 is such that the apertures therein are symmetrically disposed with respect to the drain connections 44 lying within the grid 47. The insulating layer 42 covers the grid 47 with the exception of a peripheral part (not shown) to which a lead is connected. On the lower surface of the n-type layer 41 there is a thin metal layer 49, for example of platinum, which forms a Schottky junction with the n-type layer 41. For operation of the device in the punch-through mode means are present for connecting the metal layer 49 to the metal grid 47. The metal layer 49 is sufficiently thin to allow passage of incident radiation as shown and the layer 41 and applied transmissive metal layer 49 are supported on a glass plate 51 which allows transmission of incident radiation to be detected.

The p-type semiconductor layer 43 which forms the drain connections 44 with the layer 41 also extends on the insulating layer 42 as a continuous layer. Situated on the surface of the p-type layer 43 above each drain connections 44 there is a circular metal portion 53 which forms a radiation emissive Schottky junction 54 with the p-type semiconductor layer 43. Further metal layer portions 55 in the form of strips extend on the surface of the p-type layer 43 and interconnect the circular metal layer portions 53. The first terminal connections are formed by the metal layer portions 53 which together with the metal layer portions 55 form a first common terminal. The second terminal connections of the JFET structure are formed by the metal layer grid 47 which thus forms a second common terminal, the metal layer grid 47 being connected to the metal layer 49 for two-terminal operation of the device in the punch-through mode.

In each JFET structure the gate electrode 45 has no direct ohmic connection but is capacitively connected to the drain connection 44. This is achieved due to the p-type layer 43 overlying the insulating layer 42 above the annular gate electrode 46. The gate electrode 46, insulating layer 42 and p-type layer 43 thus constitute a storage capacitor and the first terminal connection constituted by the Schottky junction forming metal layer portion 53 thus forms a common connection to the drain connection 44 (via the underlying p-type layer 43) and the side of the storage capacitor remote from the gate electrode.

By simultaneous operation of all the JFET structures in the charge storage mode described with reference to FIGS. 1 and 2 and FIG. 4 for a single JFET structure, an image intensifier action is achieved having appreciable gain due to the amplification provided by each JFET structure. Thus a radiation pattern incident at the lower side of the device as shown in FIG. 9 may be converted into an intensified image produced at the radiation emissive Schottky junctions 54. Radiation is emitted by such a Schottky junction during frame intervals when current conduction occurs between the two main terminals through the channel of the associated JFET structure, said current conduction being dependent upon the extent of the gate depletion region withdrawal produced by the incident radiation. The junctions 54 emit radiation under reverse bias conditions and this corresponds to the state when for the interrogation the first terminal is positive with respect to the second terminal. Isolation between adjacent radiation emissive Schottky junctions 54 is achieved due to the p-type layer 43 having a high resistivity.

In a modification of the embodiment shown in FIGS. 9 and 10, the semiconductor material of the p-type layer 43 is chosen such that the p-n junctions 44 which constitute the drain connections are radiation emissive p-n junctions under forward bias conditions. In this case the material of the metal layer 53, 55 is chosen such that it makes an ohmic connection to the layer 43 and the portions 53 instead of being of circular area may only be annular. Furthermore the thickness of the layer 43 is appropriately chosen to permit passage of radiation emitted by the junction 44.

Figure 11:
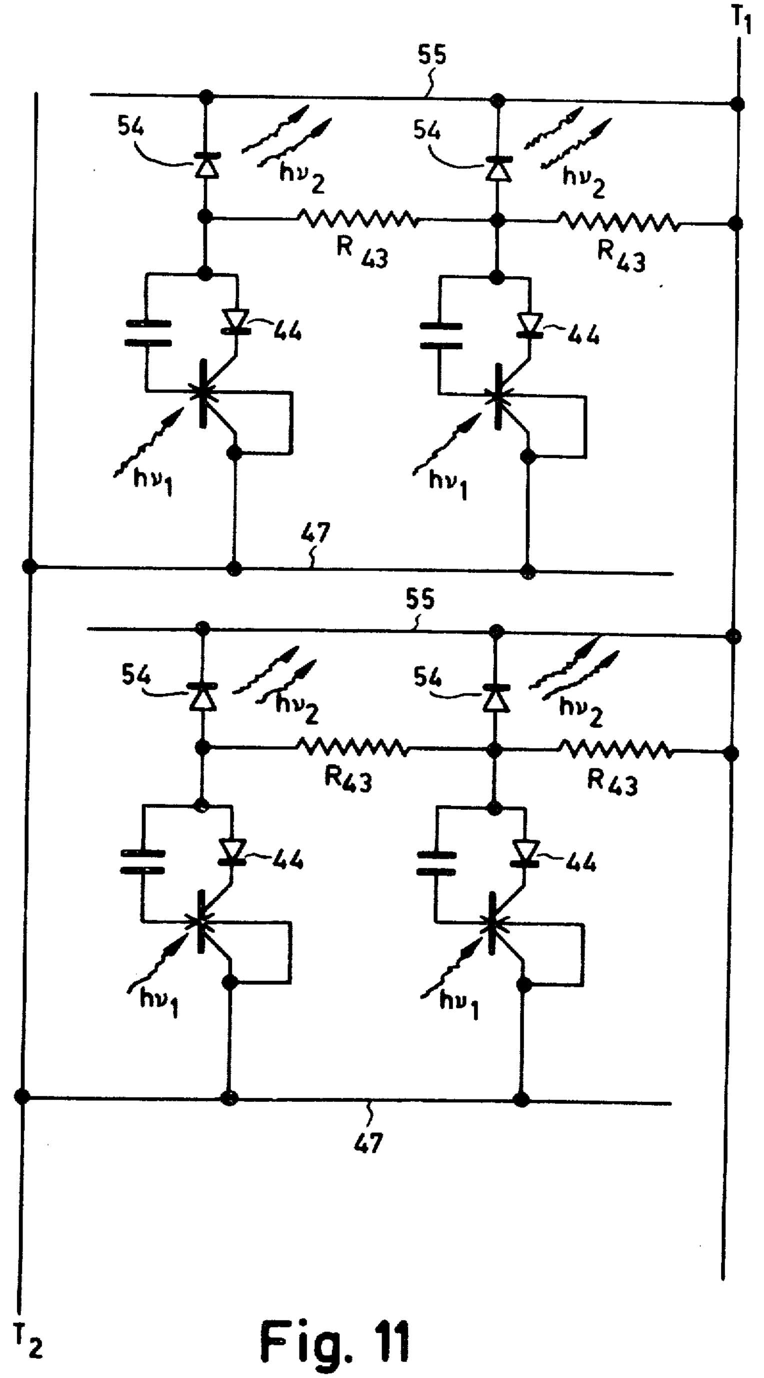
FIG. 11 shows a circuit diagram of the part of the device shown in FIG. 10.

FIG. 11 shows a circuit diagram of the part of the device shown in FIG. 10. The first common terminal connection $T_1$ is formed by the metal layer portions 53, 55 at the upper surface and the second common terminal connection $T_2$ is formed by the metal layer grid 47 connected to the metal layer 49. The drain connections 44 are shown as p-n junction diodes and in the series connection between $T_1$ and the drain connections 44 the radiation emissive Schottky junctions 54 are shown. The resistive isolation of the junctions 54 provided by the layer 43 is indicated by resistors R43.

Figure 12:
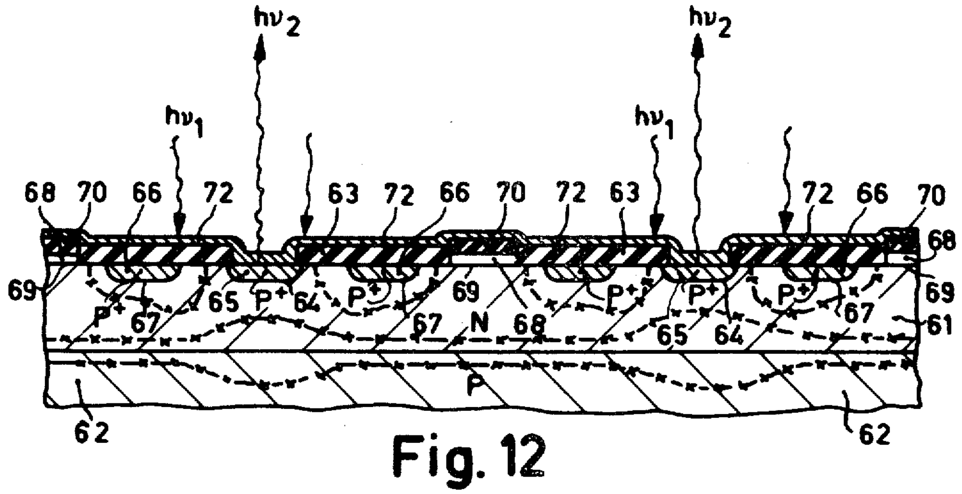
FIG. 12 shows a cross-section of part of another solid state image intensifier device in accordance with the invention.
Figure 13:
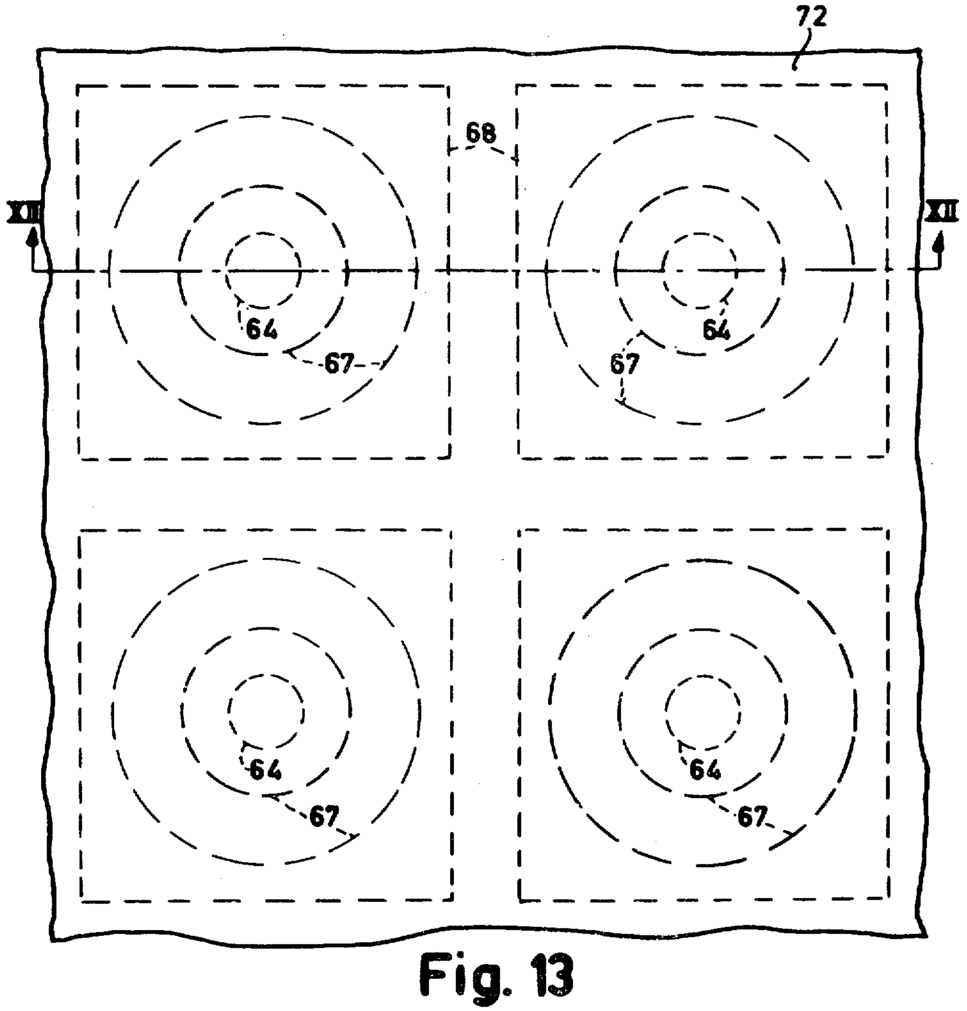
FIG. 13 shows a plan view of part of the device shown in FIG. 12, the cross-section of FIG. 12 being taken along the line XII—XII of FIG. 13.

FIGS. 12 and 13 show part of another two terminal solid state image intensifier device. A semiconductor layer 61 of n-type conductivity, for example of gallium phosphide of 5 microns thickness, is present and comprises an array of JFET structures, two of which are shown in the cross-section of FIG. 12 and four of which are shown in the plan view of FIG. 13. The n-type layer 61 is present on a p-type substrate 62, for example of gallium arsenide or gallium phosphide, the layer 61 being an epitaxial layer on the substrate 62. On the surface of the layer 61 there is an insulating layer 63. Each JFET structure comprises a drain connection 64 formed by a p-type surface region 65 of circular outline. The drain connections 64 constitute radiation emissive p-n junctions. Each $p^+$-region 65 is surrounded by an annular $p^+$-surface region 66 constituting a gate electrode region and forming a p-n junction 67 with the n-type layer 61. The source electrodes of all the JFET structures are formed by a metal layer grid 68 applied on the surface of the layer 61 and forming ohmic source connections 69. The apertures in the grid 68 are symmetrically disposed with respect to the $p^+$-regions 65 and 66. For operation in the punch-through mode the source electrode grid is connected to the p-type substrate 62. On the surface of the grid 68 there is an insulating layer portion 70 which covers said grid with the exception of a peripheral portion (not shown) for applying a conductor lead. On the surface of the insulating layer 63, 70 there is a continuous metal layer 72, for example of silver/tin, having a thickness of 200A. The metal layer 72 extends in openings in the insulating layer 63 and forms contact with the $p^+$ regions 65 and constitutes the first terminal connections of the JFET structures. The gate electrode regions 66 are completely covered by the insulating layer 63 but are capacitively connected to the drain connections 64. This occurs due to the metal layer 72 being situated on the portions of the insulating layer 63 above the $p^+$ gate regions 66, these parts thus forming a storage capacitor.

The first terminal connections are provided as a first common terminal by the metal layer 72, which in each JFET structure forms a connection to the drain connections 64 and the side of the storage capacitor remote from the gate electrode. The second terminal connections of the JFET structures are formed as a second common terminal by the source electrode metal grid 68 which is connected to the substrate 62.

By simultaneous operation of all the JFET structures in the charge storage mode as described in the previous embodiment a radiation pattern incident at the upper side of the body may be converted into an intensified image produced by the radiation emissive p-n junctions 64. Radiation is emitted by such a junction during frame intervals when current conduction occurs between the two main terminals through the channel of the associated JFET structure, said current conduction being dependent upon the extent of the gate depletion region withdrawal produced by the incident radiation. Gain is achieved due to the amplification provided by each JFET structure. It will be appreciated that undesirable optical feedback in the form of the emitted radiation being absorbed and causing further generation of free charge carriers in such manner that further withdrawal of the gate depletion region occurs must be avoided. This can be achieved by providing a suitable spacing of the $p^+$ regions 64 and 66 consistent with maintaining the desired resolution of the device.

Figure 14:
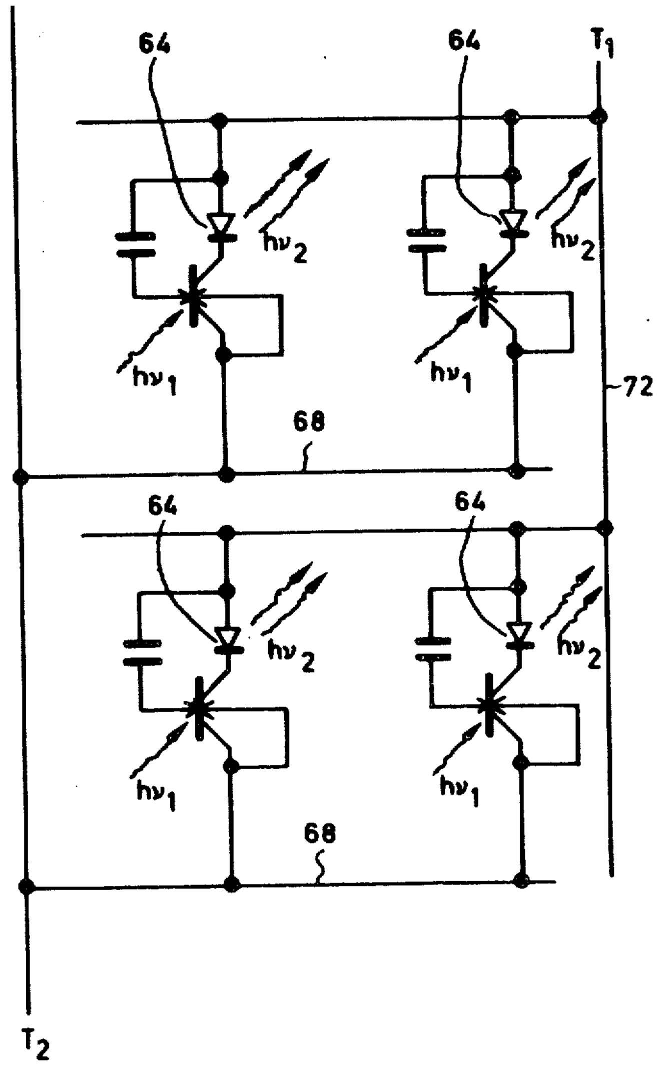
FIG. 14 shows a circuit diagram of the part of the device shown in FIG. 13.

FIG. 14 shows a circuit diagram of the part of the device shown in FIG. 13. The first common terminal connection $T_1$ is formed by the metal layer 72 at the upper surface and the second common terminal connection $T_2$ is formed by the metal layer grid 68 which is connected to the p-type substrate 62. The drain connections 64 are shown as radiation emissive p-n junction diodes.

In modifications of the image intensifier device shown in FIGS. 12 and 13, the structure is such that radiation is incident from the lower side of the layer 61. In one form this is achieved by using a relatively thin p-type substrate of a semiconductor material having a higher energy band gap than that of the layer whereby incident radiation to be detected can pass through the substrate and be absorbed in the n-type layer 61. In another form the p-type substrate is replaced by a transmissive metal layer forming a Schottky junction with the n-type layer 61.

It will be appreciated that numerous modifications may be made to the embodiments described and furthermore that modified operational modes may be employed. Thus, for example, with a view to optimising the radiation wavelength response of a device the substrate/layer p-n junction or Schottky contact junction at the lower side of the semiconductor layer may be reverse biased to produce a depletion region extending into the layer. Furthermore operation with such a reverse bias applied may still be carried out in a punch-through mode in which a higher resetting voltage pulse $V_R$ will be required to cause the gate depletion region to drive the substrate/layer junction or Schottky contact junction depletion region back to said junction.

A device in accordance with the invention in which a plurality of JFET imaging elements have two common terminal connections may be other than a solid state image intensifier or active photocathode. It may form a device for use in electrophotography wherein an image is transferred into a charge pattern present at metal layer pad portions in series with the source and/or drain of each JFET structure.

What we claim is:

1. A radiation sensitive solid state device comprising a semiconductor body having a semiconductor layer of one conductivity type, at least one radiation sensitive element being present in the semiconductor layer and comprising a junction field effect transistor structure, said junction field effect transistor structure comprising source and drain connections at positions spaced apart laterally of the semiconductor layer whereby in the layer portion situated intermediate said connections a substantially lateral flow of charge carriers characteristic of said one conductivity type can occur in a channel region, at least one of said source and drain connections being present at a first surface of the semiconductor layer, a gate electrode situated at or adjacent said first surface in the proximity of the channel region and forming a rectifying junction with the semiconductor layer material of the one conductivity type whereby said lateral current flow in the channel region is determined in accordance with the extent of a depletion region associated with and extending into the layer from said rectifying junction, said gate electrode being connected via a storage capacitor present at or adjacent to said first surface to the said one of the source and drain connections, a first terminal connection forming a common connection to said one of the source and drain connections and to the side of the capacitor remote from the gate electrode, and a second terminal connection to the other of said source and drain connections, means being present to permit incident radiation to be absorbed in the semiconductor layer in the vicinity of the channel region for generation of free charge carriers in order to influence the extent of a depletion region associated with the gate electrode rectifying junction.

2. A radiation sensitive solid state device as claimed in claim 1, wherein an insulating layer is present at said first surface of the semiconductor layer and extends on the gate electrode, the storage capacitor being formed by the capacitive connection of the gate electrode via the insulating layer to the said one of the source and drain connections by a conductive layer which overlies at least a part of the insulating layer present on the gate electrode, the first terminal connection being applied to said conductive layer.

3. A radiation sensitive solid state device as claimed in claim 1, wherein the semiconductor layer of the one conductivity type is present on a semiconductor substrate of the opposite conductivity type, said first surface of the semiconductor layer being the surface remote from the substrate.

4. A radiation sensitive solid state device as claimed in claim 3, wherein means are present for connecting the other of said source and drain connections to the substrate.

5. A radiation sensitive solid state device as claimed in claim 1, wherein at a second surface of the semiconductor layer situated opposite the first surface a conductive layer is present which forms a Schottky junction with the semiconductor layer material of the one conductivity type.

6. A radiation sensitive solid state device as claimed in claim 5, wherein means are present for connecting the other of said source and drain connections to the conductive layer at the second surface of the semiconductor layer.

7. A radiation sensitive solid state device as claimed in claim 5, wherein the conductive layer at the second surface of the semiconductor layer is of such a material and thickness as to allow passage of incident radiation.

8. A radiation sensitive solid state device as claimed in claim 1, wherein the gate electrode consists of a surface region of the opposite conductivity type in the semiconductor layer of the one conductivity type.

9. A radiation sensitive solid state device as claimed in claim 1, wherein the gate electrode consists of a metal layer applied on the first surface of the semiconductor layer and forming a Schottky junction with the layer material of the one conductivity type.

10. A radiation sensitive solid state device as claimed in claim 1, wherein a plurality of radiation sensitive elements are present in the semiconductor layer, each element comprising a junction field effect transistor structure having a gate electrode which surrounds the said one of the source and drain connections.

11. A radiation sensitive solid state device as claimed in claim 10, and consisting of a solid state imaging device having means capable of yielding separate electrical output signals indicative of the radiation absorbed in the channel region of each junction field effect transistor structure.

12. A solid state imaging device as claimed in claim 11, wherein the first terminal connections associated with the plurality of junction field effect transistor structures are individually provided and the second terminal connections associated with said plurality of junction field effect transistor structures are provided as a common terminal connection.

13. A radiation sensitive solid state device as claimed in claim 10 and consisting of a solid state image conversion and/or display device, wherein the first terminal connections associated with the plurality of junction field effect transistor structures are provided as a first common terminal connection and the second terminal connections associated with the plurality of junction field effect transistor structures are provided as a second common terminal connection.

14. A radiation sensitive solid state device as claimed in claim 13 and consisting of a solid state image intensifier, wherein for each radiation sensitive element electroluminescent means are situated in the series connection between the said one of the source and drain connections and the first common terminal connection, the output of each electroluminescent means being determined in accordance with the current flow in the channel region of the associated junction field effect transistor structure when applying a potential difference between the first and second common terminal connections.

15. A solid state image intensifier as claimed in claim 14, wherein the electroluminescent means each comprise a portion of a semiconductor layer of the opposite conductivity type, the drain connections of the plurality of junction field effect transistor structures being present at the first surface and formed by said semiconductor layer of the opposite conductivity type.

16. A solid state image intensifier as claimed in claim 15, wherein an insulating layer is present on the first surface and overlies the gate electrodes of the junction field effect transistor structures, the semiconductor layer of the opposite conductivity type forming the drain connections at openings in the insulating layer and further extending on the insulating layer above the gate electrodes to form the capacitive connections between the gate electrodes and the drain connections.

17. A solid state image intensifier as claimed in claim 16, wherein the first terminal connections associated with each junction field effect transistor structure comprise metal layer portions on the surface of the semiconductor layer of the opposite conductivity type, said metal layer portions being situated above the drain connections and being interconnected to form a first common terminal connection by further metal layer portions present on the surface of the semiconductor layer of the opposite conductivity type.

18. A solid state image intensifier as claimed in claim 17, wherein said metal layer portions situated on the semiconductor layer of the opposite conductivity type above the drain connections form radiation emissive Schottky junctions with the semiconductor layer of the opposite conductivity type.

19. A solid state image intensifier as claimed in claim 14, wherein the electroluminescent means each comprise a surface region of the opposite conductivity type extending in the semiconductor layer, the drain connections of the plurality of junction field effect transistor structures being present adjacent the first surface and formed by the surface regions of the opposite conductivity type, each drain connection also constituting a radiation emissive p-n junction.

20. A solid state image intensifier as claimed in claim 19, wherein an insulating layer is present on the first surface and overlies the gate electrodes of the junction field effect transistor structures, a plurality of openings being present in the insulating layer where said regions of the opposite conductivity type extend at the first surface, a metal layer forming contact to said regions of the opposite conductivity type in said openings and further extending on the insulating layer above the gate electrodes to form the capacitive connections between the gate electrodes and the drain connections, the metal layer constituting the first terminal connections of the junction field effect transistor structures which connections are interconnected by the metal layer as a first common terminal, the metal layer being of such a material and thickness as to permit transmission of the radiation emitted by the p-n junctions.

21. A radiation sensitive solid state device as claimed in claim 13 and consisting of a solid state imaging active photocathode, wherein the semiconductor material of the layer is of n-type conductivity and for each radiation sensitive element the said one connection at the first surface is the drain connection of the junction field effect transistor structure, said drain connections each being formed by p-type semiconductor material and constituting injecting connections for injection of electrons into the p-type semiconductor material, means being present for permitting injected electrons to emerge from the p-type semiconductor material.

22. A solid state photocathode as claimed in claim 21, wherein an insulating layer is present on the one surface and overlies the gate electrodes of the junction field effect transistor structures, a plurality of openings being present in the insulating layer, a layer of p-type semiconductor material extending in said openings and forming the electron injecting drain connections, said p-type layer further extending on the insulating layer above the gate electrodes to form the capacitive connections between the gate electrodes and the drain connections.

23. A solid state photocathode as claimed in claim 22, wherein the first terminal connections of the junction field effect transistor structures comprise metal layer portions situated on the surface of the p-type semiconductor layer in the proximity of the electron injecting drain connections, said metal layer portions being interconnected to form a first common terminal connection by further metal layer portions present on the surface of the p-type semiconductor layer.

24. A solid state photocathode as claimed in claim 23, wherein surface portions of the p-type semiconductor layer situated opposite the electron injecting connections are coated with a material reducing the work function of electrons, the coating and the p-type semiconductor material being such that the work function of the coating applied is substantially equal to or less than the distance between the Fermi level and the bottom of the conduction band in the p-type semiconductor material.

25. A radiation sensitive solid state device as claimed in claim 13 and consisting of a solid state image intensifier, wherein for each radiation sensitive element electroluminescent means are situated in the series connection between the other of said source and drain connections and the second common terminal connection, the output of each electroluminescent means being determined in accordance with the current flow in the channel region of the associated junction field effect transistor structure when applying a potential difference between the first and second common terminal connections.

26. A device as claimed in claim 1, comprising means for periodically applying a charging potential and means for applying an interrogation potential difference as a steady bias between the first and second terminal connections to obtain during each storage period between successive applications of the charging potential an integrated output indicative of the radiation absorbed in said storage period.

* * * * *